(12) United States Patent
Ahlgren et al.

(10) Patent No.: US 6,881,259 B1
(45) Date of Patent: Apr. 19, 2005

(54) IN-SITU MONITORING AND CONTROL OF GERMANIUM PROFILE IN SILICON-GERMANIUM ALLOY FILMS AND TEMPERATURE MONITORING DURING DEPOSITION OF SILICON FILMS

(75) Inventors: David C. Ahlgren, Wappingers Falls, NY (US); Jack Oon Chu, Manhasset Hill, NY (US); Basanth Jagannathan, Stormville, NY (US); Ryan W. Wuthrich, Burlington, VT (US)

(73) Assignee: International Business Machines Corporation, Armonk, NY (US)

( * ) Notice: Subject to any disclaimer, the term of this patent is extended or adjusted under 35 U.S.C. 154(b) by 172 days.

(21) Appl. No.: 09/633,857

(22) Filed: Aug. 7, 2000

(51) Int. Cl.[7] .............................................. C30B 25/16
(52) U.S. Cl. ......................... 117/85; 117/86; 117/939; 117/935; 118/715
(58) Field of Search ............................ 117/86, 85, 935, 117/939; 118/715

(56) References Cited

U.S. PATENT DOCUMENTS

| | | | |
|---|---|---|---|
| 5,288,645 A | * | 2/1994 | Toshima et al. ............ 436/144 |
| 5,443,033 A | | 8/1995 | Nishizawa et al. |
| 5,951,757 A | | 9/1999 | Dubbelday |
| 6,010,914 A | | 1/2000 | Shishiguchi |
| 6,015,478 A | | 1/2000 | Satoh |

OTHER PUBLICATIONS

Maley et al., "Infrared reflectance spectroscopy of very thin films of hydrogenated amorphous silicon", J. Non–crystalline Solids., vol. 114 (1) 1989 pp. 163–165 abstract only.*

Abelson et al., "Surface hydrogen release during the growth of a–Si:H by reactive magnetron sputtering", Journal of Vacuum Science and Technology A vol. 8, No. 3 pt. 1 pp. 1364–1368 May–Jun. 1990 abstract only.*

Pejnefors et al.' "Chemical vapor deposition of undoped and in–situ boron and arsenic doped epitaxial and polycrstalline silicon films grown using silane at reduced pressure", Journal of Applied Physics vol. 88 No. 3 pp. 1655–1663 Aug. 2000.*

L.L. Tedder et al.; "Real–Time Process and Product Diagnostics in Rapid Thermal Chemical Vapor Deposition Using In Situ Mass Spectrometric Sampling"; J. Vac. Sci. Technol. Jul./Aug. 1995; pp. 1924–1927.

* cited by examiner

*Primary Examiner*—Robert Kunemund
(74) *Attorney, Agent, or Firm*—Whitham, Curtis & Christofferson, P.C.; Joseph P. Abate

(57) ABSTRACT

Analysis of residual gases from a process for depositing a film containing silicon on a crystalline silicon surface to determine partial pressure of hydrogen evolved during deposition develops a signature which indicates temperature and/or concentration of germanium at the deposition surface. Calibration and collection of hydrogen partial pressure data at a rate which is high relative to film deposition rate allows real-time, in-situ, non-destructive determination of material concentration profile over the thickness of the film and/or monitoring the temperature of a silicon film deposition process with increased accuracy and resolution to provide films of a desired thickness with high accuracy.

18 Claims, 7 Drawing Sheets

IN-SITU MONITORING AND CONTROL OF GERMANIUM PROFILE IN SILICON-GERMANIUM ALLOY FILMS AND TEMPERATURE MONITORING DURING DEPOSITION OF SILICON FILMS

BACKGROUND OF THE INVENTION

1. Field of the Invention

The present invention generally relates to the manufacture of semiconductor devices and, more particularly, to high sensitivity in-situ monitoring and control of low temperature epitaxy processes for deposition of materials, especially silicon and silicon-germanium (SiGe) films.

2. Description of the Prior Art

Benefits of increased functionality and performance as well as manufacturing economy derived from increased integration density have encouraged developments in lithography and other semiconductor manufacturing processes to scale circuit elements such as transistors and memory cells to extremely small sizes. However, at such small sizes, relatively slight imperfections in the structures developed, such as variations in thickness of a silicon film, may become significant or even critical. Further, the composition of alloy films becomes of extreme importance since the conduction properties of alloys films may vary widely depending on relative proportions of materials in the alloy and even variations in proportions of materials with depth within the alloy film.

Unfortunately, process parameters such as temperature and reactant gas flows may not be easily monitored or accurately controlled and measurements are complicated by the dynamics of chemical reactions which are necessary to many semiconductor manufacturing processes. Therefore, at the current state of the art, deposition of films of certain desired properties is largely a matter of trial and error to develop suitable process parameters and the resulting film properties must be empirically verified through destructive testing which is slow and reduces process throughput and yield (since samples must be destroyed).

Specifically, for deposition of silicon and SiGe films at low temperatures, it is common practice to grow alloy films on a plurality of wafers simultaneously, since the growth of these films is typically very slow. When the process is complete, a sample wafer is removed from the batch and tested by, for example, secondary ion mass spectroscopy (SIMS) to determine the alloy composition profile over the thickness of the film. The SIMS process is very time-consuming and expensive and results may not be available for several days. Meanwhile, the remainder of wafers in the batch cannot be used in manufacturing and may not be usable at all if the SIMS testing does not confirm that the desired composition profile has been achieved.

Even for growth of silicon films, the rate of deposition during low temperature epitaxy processes varies exponentially with temperature and temperature drifts of only tens of degrees Centigrade can cause substantial variation in film thickness over the relatively long deposition times. Again, achievement of the desired film properties must be confirmed by destructive testing which is time consuming and expensive while delaying the utilization of similarly processed wafers or requiring them to be discarded or diverted to production of other devices for which the film may be appropriate.

The thermal mass of the reaction chamber (including the relatively large number of wafers being simultaneously processed) and potential temperature measurement inaccuracy (e.g. since the sensor(s) can not be ideally located) precludes temperature regulation to accuracies of less than the variation alluded to above and does not allow real-time monitoring and control of the progress of the deposition process.

One approach to non-destructive and/or in-situ determination of film thickness and properties has relied on optical reflection from a deposited surface since reflection, in turn depends on film thickness and refractive index of the deposited material. However, this technique has many shortcomings in that it relies on the additional growth of a test pattern comprising a layer of oxide and Si/SiGe to make viable measurements and such a structure may not be tolerated by the overall process requirements. Further, for real-time/in-situ measurement and/or control, the analyzing light must be passed through optical windows in the processing chamber which may be coated with the material being deposited; causing errors in the measurement which is of relatively low resolution even under ideal conditions. Moreover, chemical composition within the film cannot be accurately measured since thee optical interference relied upon inherently averages material properties over a thickness region.

The use of a residual gas analyzer (RGA) is known for monitoring the progress of growth of gallium arsenide (GaAs) films by setting the peak selector of the ion sensor to sense the introduced gas molecules, trimethyl gallium (TMG) and Arsine. The reaction byproduct, methane, is or would be seen for only one-half the growth cycle. This use of RGA, therefore, only qualitatively and indirectly observes the GaAs growth process to confirm that the process gases were, in fact, introduced into the chamber for a certain period of time. Further, this process does not and is not required to determine the ratio of Ga and As since the ratio is fixed at. 1:1 in a GaAs film, whereas the amount of each of the constituent materials in an alloy like SiGe can vary from substantially 0% to 100%.

Accordingly, it is seen that the present state of the art does not allow accurate monitoring or real-time control or compensation of film deposition processes or allow avoidance of time-consuming delays, loss of manufacturing yield and inefficiencies due to the cost of samples destructively tested. Moreover, the present state of the art does not provide any technique of developing particular desired alloy constituent concentrations other than by substantially trial and error methods. Since the constituent material concentration, such as the percentage of germanium in a SiGe alloy, controls all of the material and electrical properties of the alloy, it is critical to device fabrication methods to measure material concentration.

SUMMARY OF THE INVENTION

It is therefore an object of the present invention to provide an in-situ and real time process monitoring methodology which allows control and compensation of processes for deposition of silicon and silicon alloy films to achieve specific desired thicknesses and/or germanium concentration profile over the thickness of the film.

It is another object of the invention to provide a method and apparatus which allows quantitative observation of the progress of silicon and alloy film growth, in-situ.

In order to accomplish these and other objects of the invention, a method and apparatus for performing the method are provided for depositing a film containing silicon on a crystalline silicon surface, including steps of introducing a gas containing precursor material into a reaction vessel, adsorbing an activated species formed from the precursor material on the crystalline silicon surface, and determining a partial pressure of hydrogen in residual gases as the activated species is deposited on the crystalline silicon surface.

BRIEF DESCRIPTION OF THE DRAWINGS

The foregoing and other objects, aspects and advantages will be better understood from the following detailed description of a preferred embodiment of the invention with reference to the drawings, in which.

DETAILED DESCRIPTION OF A PREFERRED EMBODIMENT OF THE INVENTION

Figure 1:
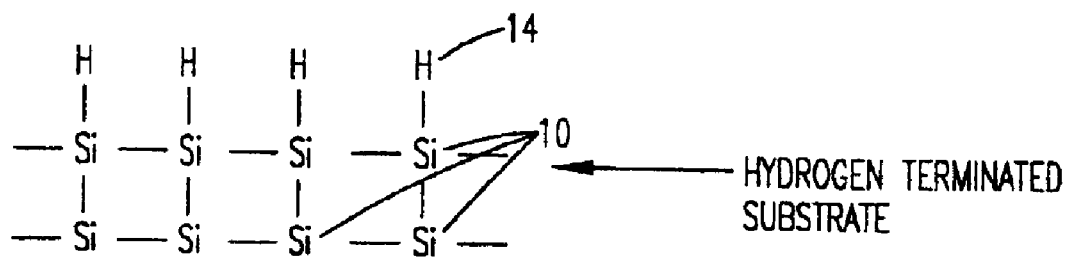
FIGS. 1, 2 and 3 are diagrams of the crystal structure of monocrystalline silicon, and the theoretical growth of monocrystalline silicon and SiGe alloy films.
Figure 2:
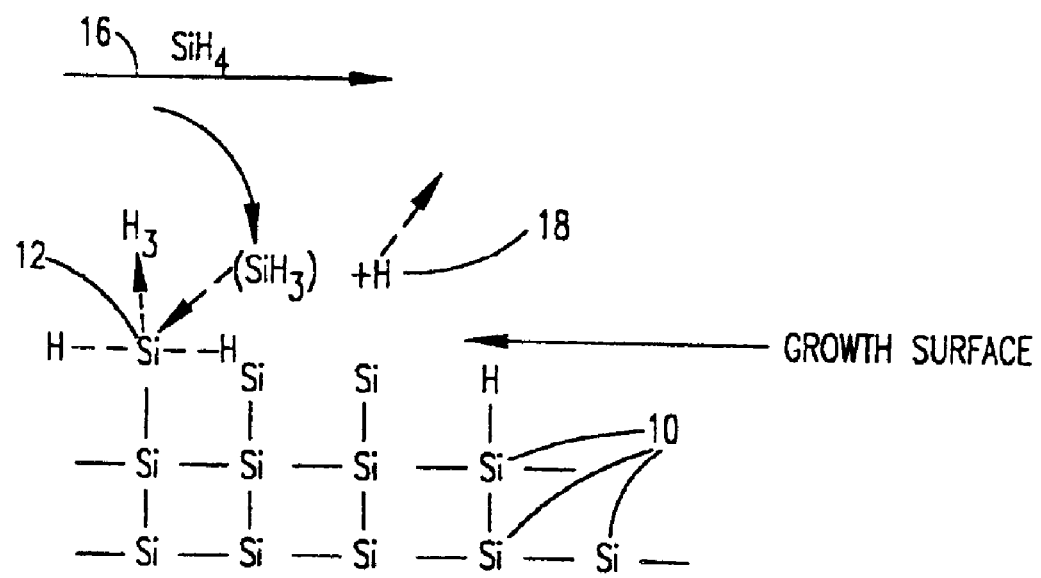
Figure 3:
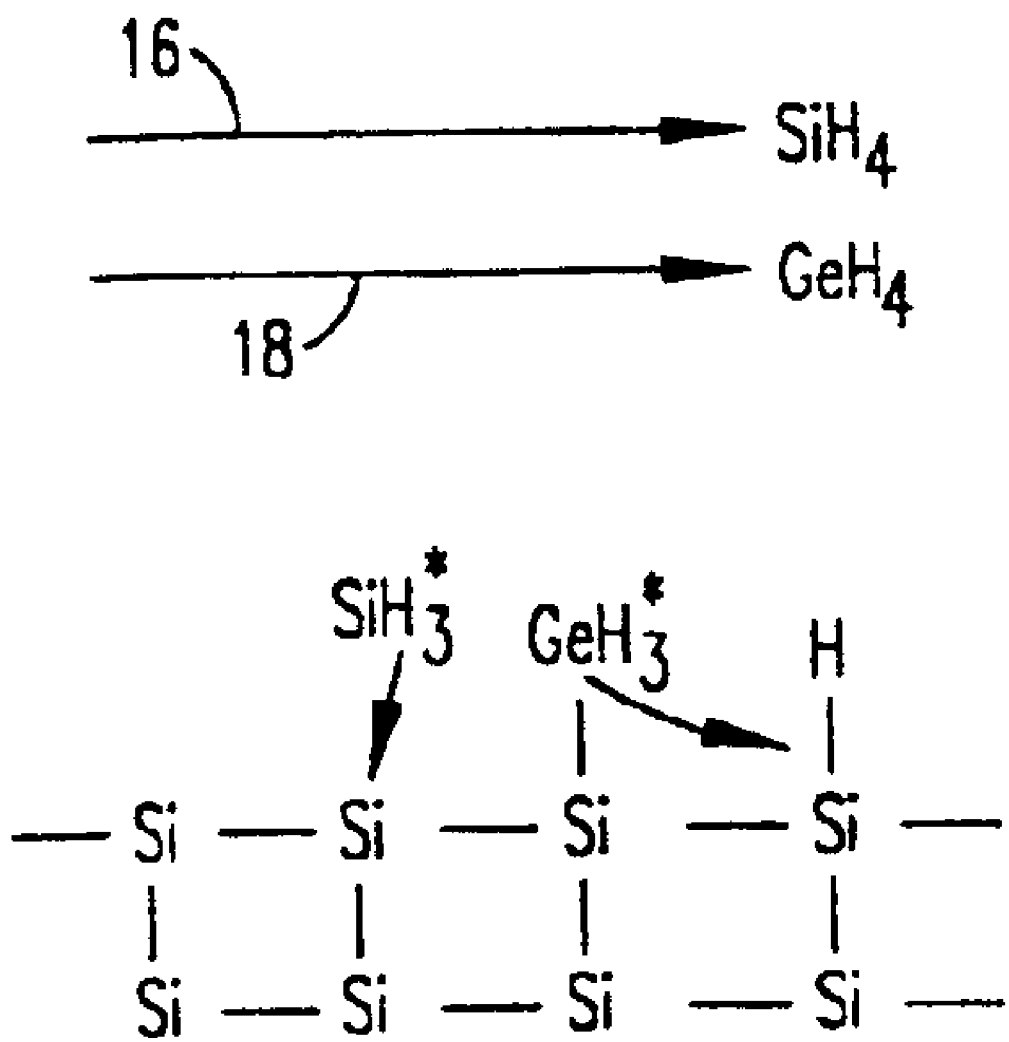

Referring now to the drawings, and more particularly to FIGS. 1–3, there is shown a simplified theoretical crystal structures of monocrystalline silicon. In the following discussion, particularly in regard to FIGS. 1–3, it is to be understood that the subject matter described represents the current theoretical understanding of the effects which underlie the invention and which support the empirical observations upon which the invention is based, as reported in the current technical literature.

It is to be further understood that the practice of the invention and the achievement of the meritorious effects thereof are fully supported by empirical observations and do not rely, in any way, upon the theoretical explanation thereof which will now be discussed in the interest of completeness and to facilitate the understanding and practice of the invention. Accordingly, the inventors do not wish to be held to any particular theory accounting for the effects exploited in the practice of the invention and the details of the physical and chemical processes which may, in fact, produce the effects are not important to the practice of the invention.

FIG. 1 shows a crystal structure for monocrystalline <100> silicon. The silicon atoms indicated by reference numeral 10 are an existing crystal lattice which is assumed to continue indefinitely to the right, left and bottom of the drawing, as shown as well as into and out of the plane of the page. Silicon atoms 10 at the top surface of the crystal lattice will have bonds which are not attached to other silicon atoms and which are populated with hydrogen atoms 14.

It should also be appreciated that deposition of silicon is normally performed from silane ($SiH_4$) gas precursor. FIG. 2 thus depicts epitaxial deposition of silicon on a monocrystalline silicon structure. Specifically, flow of silane gas is depicted by arrow 16. Under the deposition conditions of low temperature and pressure (e.g. below about 650° C. and about 50 mTorr) of an exemplary UHV-CVD system, activated $SiH_3^*$ metastable species are created from the silane as it is adsorbed on the monocrystalline silicon surface, liberating a hydrogen atom 18. The adsorbed activated species can move on the surface of the monocrystalline silicon structure until it encounters a favorable site to be incorporated into the monocrystalline lattice. The limiting step for growth of the silicon film is considered to be the desorption of the terminating hydrogen atom 14 on the silicon surface. (The hydrogen atoms, of course form molecules of hydrogen gas.) Thus epitaxial deposition of silicon on a monocrystalline silicon structure causes evolution of hydrogen gas ($H_2$) with each atom of silicon deposited.

However, during the deposition of SiGe alloy in a crystalline form on a hydrogen terminated silicon surface (generally from germane ($GeH_4$) gas 18, as depicted in FIG. 3), the presence of germanium atoms weakens the Si—H bond and thus lowers the energy of hydrogen desorption. Published and experimental work generally conclude that this is a catalytic effect of germanium or its activated $GeH_3^*$ species. Regardless of the actual mechanism, an increase in the evolution of hydrogen gas in the presence of germanium and the amount of the increase depends on the surface concentration of germanium atoms at the growth surface. If conditions of temperature and silane partial pressure are fixed, the rate of hydrogen release, in turn, depends upon germane gas flow rate.

Growth of silicon film on a polycrystalline surface is quite different from the mechanisms described above because of the difference in the growth surface presented. While a <100> surface was assumed in FIGS. 1–3 for monocrystalline silicon, a polycrystalline growth surface will present a number of different crystal orientations such as <111> and <311> in addition to the <100> type. The boundaries of the crystal grains are also a source of dangling bonds which alter the electric potential on the growth surface. These factors reduce mobility of the adsorbed $SiH_3^*$ species to move to an energetically favorable site for incorporation into the polycrystalline structure; resulting in a reduced growth rate of polycrystalline silicon relative to monocrystalline silicon. Therefore, while the surface of polycrystalline silicon is populated with hydrogen, the amount of hydrogen released per unit time due to silicon film growth is very much reduced compared to epitaxial silicon film growth on a monocrystalline silicon structure.

Therefore, it is seen that substantially different amounts of hydrogen gas ($H_2$) is evolved for each of these processes which are involved in the practice of the invention. These differences are counter-intuitive since it would be expected that, on average, four hydrogen atoms (two hydrogen molecules) would be evolved for each atom of either silicon or germanium deposited from silane or germane, respectively. However, by consideration of the reactant gas mass input rate and film deposition rate, these different effects can be distinguished to the degree necessary to practice the invention and realize the meritorious effects of in-situ determination of germanium concentration profile in an SiGe alloy film and process regulation for enhanced control of Si epitaxial film thickness as will be explained below.

Figure 4:
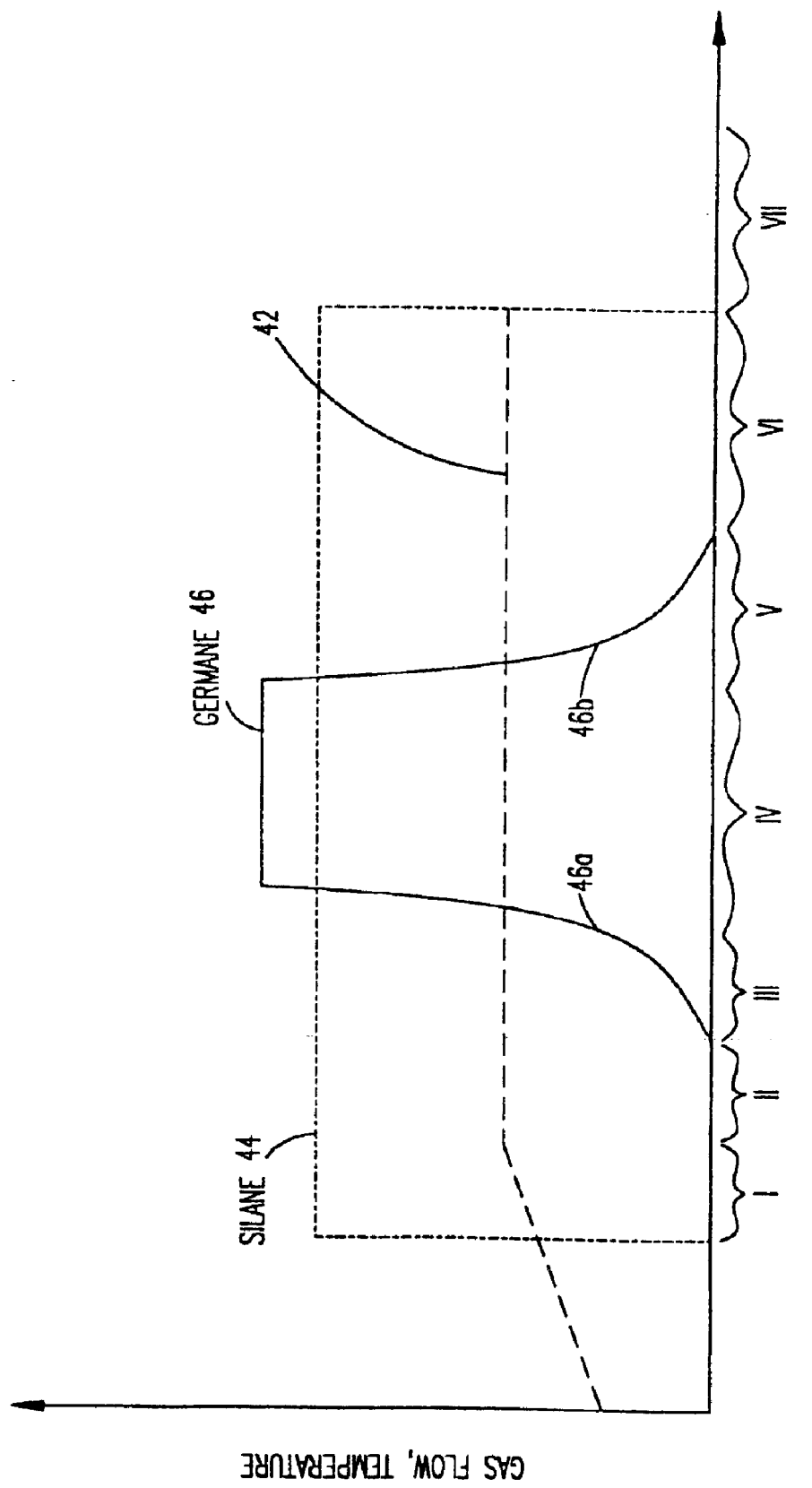
FIGS. 4, 5 and 6 are exemplary graphical depictions of relationships among parameters of a film deposition process in accordance with the invention.
Figure 5:
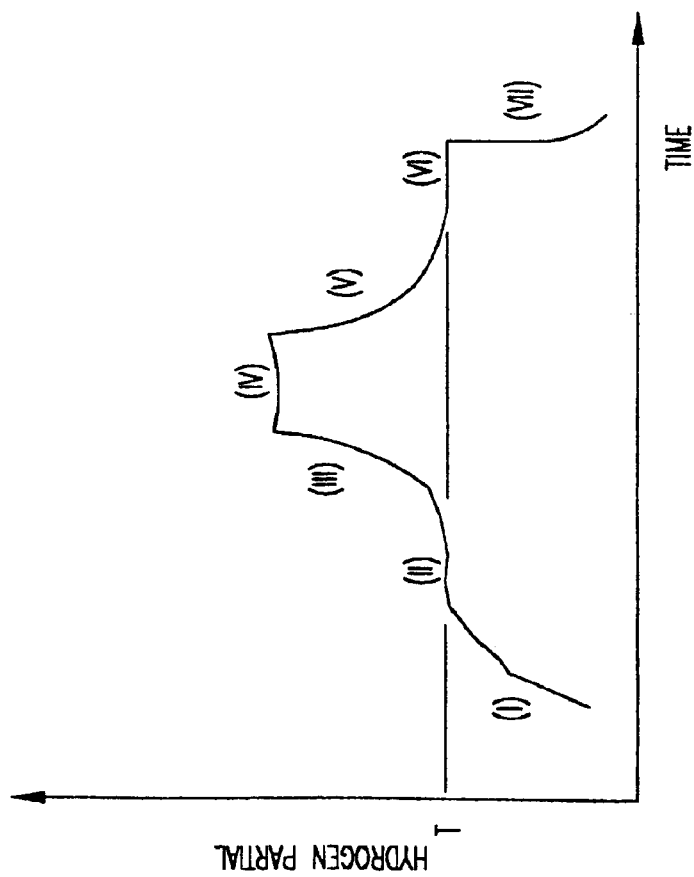

Referring now to FIG. 4, an exemplary process which is useful in conveying an understanding of the invention relative to variations in process parameters-over time is depicted graphically. This temperature variation is depicted by dashed line 42 while mass flow rates of silane and germane gas are depicted by profiles 44 and 46, respectively. (While furnace temperatures are maintained constant during a specified process, the temperature variation shown in region I of FIG. 5 is a result of wafers heating up from room temperature. The temperature in region VII of FIG. 5 is unimportant and not illustrated since no reaction gases are input consistent with removal of the wafers from the furnace.) Thus, in this exemplary deposition process, the temperature is maintained substantially constant for the deposition process duration.

For purposes of this discussion, it is assumed that silane introduction is begun during the period of temperature increase (although in a production process, silane would only be introduced after the wafers had reached the process/furnace temperature) and that the mass flow rate of silane is maintained substantially constant over the entire period that silane is introduced, as shown by profile 44. During the period that temperature and silane flow rate are constant, the mass flow rate of germane gas is ramped up, held constant for a period and ramped down, as shown by profile 46. The "exponential" appearance of regions 46a and 46b of profile 46 is arbitrarily depicted and is unimportant to the practice of the invention.

Thus, the exemplary process depicted in FIG. 4 includes regions with temperature change of the wafer at the beginning of the process and no input gases at the beginning and end of the process (which are of no concern since no deposition occurs without gas flow), a region (I) with temperature change of the wafer and constant silane flow, two regions (II and VI) with constant temperature and constant silane flow, two regions (III and V) with constant temperature and silane flow and variable germane flow and a single region (IV) with constant temperature and constant silane and germane flow.

FIG. 5 graphically illustrates the variation in hydrogen partial pressure during the process depicted in FIG. 4. In region I, the hydrogen evolution rate increases with increasing wafer temperature for a constant silane flow but stabilizes at a relatively low level in region II as the wafer temperature come to an equilibrium with the furnace. In region III, however, the hydrogen partial pressure again increases sharply as the germane mass flow is increased, stabilizing at a high level in region IV where the germane mass flow is held substantially constant. Regions V and VI are substantially symmetrical to regions III and II, respectively while in region VII, the hydrogen partial pressure decreases sharply as the reaction gas flow (and the deposition process) is terminated.

It should be noted from FIG. 5 that regions I and II (and VI) show variation of hydrogen evolution which is substantially exponential with increase in temperature and thus reflects the exponential change in silicon film deposition rate with temperature change and substantially constant hydrogen evolution rate when temperature and silane flow rate are both constant. Regions III, IV and V show that evolution of hydrogen is significantly increased in the presence of germanium and substantially proportional to the germanium mass flow rate. As discussed above, the amount of germanium in a deposited SiGe film is also proportional to the germanium mass flow rate. Therefore, the partial pressure of hydrogen at any instant in time during a deposition process above a temperature dependent threshold, T, is a signature for the amount of germanium being deposited in an SiGe film at a substantially fixed and constant temperature. Below the temperature dependent threshold, T, and in the absence of input of germane gas, the partial pressure of hydrogen is a signature indicating the rate of silicon deposition.

It should be noted that the temperature dependent threshold, T, is an equilibrium threshold at the furnace temperature and ideally does not vary for a given furnace/process temperature. However, since silicon deposition rates vary exponentially with temperature, the threshold, T, will differ for different process and furnace temperatures. As will be explained in greater detail below, this temperature dependency is exploited in accordance with the invention to monitor process temperature with greater resolution, accuracy (with respect to actual wafer temperature) and with reduced response time than has previously been possible since it directly indicates conditions at the deposition surface.

It should also be appreciated that very dilute germane is normally used as a precursor in the SiGe alloy deposition process. Under these conditions, the partial pressure of germane at the RGA is quite low. To get strong signals and suitable gain for detection of germane, an electrical potential of at least 1 KV must be applied to the electron multiplier of the RGA which leads to complications related to measurement or gain stability and repeatability and erroneous conclusions from measurements can be a result of simple gain drift in the RGA and, in any event, do not reflect the reaction occurring during deposition.

Hydrogen sensing, on the other hand, is a direct measure of reaction kinetics on the wafer surface. For germanium deposition, it is proportional to the amount of Ge incorporated into the deposition surface at any instant in time and can thus be exploited to derive a material concentration profile in a deposited crystalline alloy file. Conversely, if the expected hydrogen evolution and germanium profile is not observed even though germane mass flow is correct (for example, if the deposition is not proceeding in a crystalline form or if a contaminant is affecting film growth) improper film growth would be directly indicated in accordance with the invention. Such a result could not be detected by or deduced from monitoring of the partial pressure of germane.

Figure 6:
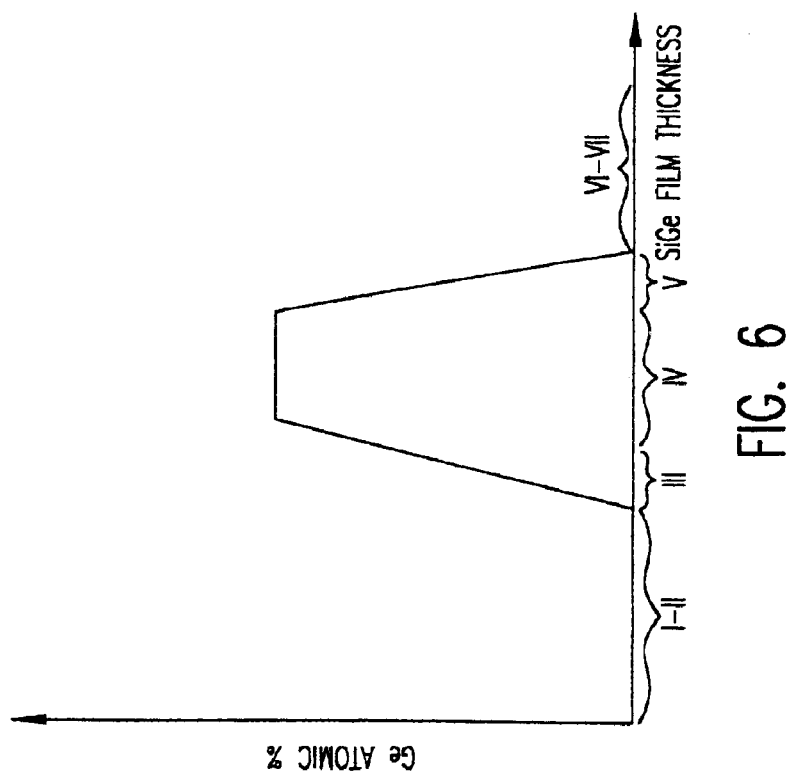

In the context of this discussion, it should also be understood that the term "signature" is intended to indicate that any particular value of hydrogen evolution rate will uniquely correspond to a deposition rate of silicon film in the absence of germane or a germanium percentage in a film of SiGe alloy in the presence of germane and at a constant temperature. More specifically, as shown in FIG. 6, the germanium percentage in a deposited SiGe film is substantially constant for a substantially constant hydrogen partial pressure (region IV) and ramps up and down with germane gas flow as a monotonic function of hydrogen gas partial pressure. The particular value of silicon deposition rate or germanium percentage in an SiGe alloy can be established by a simple calibration process that can, for convenience, be carried out in a manner similar to the process depicted in FIG. 4.

That is, the quantitative relationship between the variation in hydrogen partial pressure and temperature (either with or without germane gas flow) and the quantitative relationship between variation in hydrogen partial pressure and germane gas flow can be measured during a process or processes in which temperature and germane gas flow are independently varied. Then, the SiGe film growth rate can be determined from the measured thickness of the deposited alloy film and the process duration. The calibration is then completed by determining the percentage germanium in the alloy film as a function of the germane mass flow rate.

Thus, if during the calibration period, the germane mass flow rate can be accurately known, the percentage of germanium being deposited in a SiGe film in the actual (e.g. production) process sequence can be known from the rate of hydrogen evolution at any given point in time during the deposition process for any given temperature. In other words, calibration relating hydrogen partial pressure to germane gas flow rates allows conversion of hydrogen partial pressure variation with time to germane flow rate variation with time and, in turn, SiGe alloy film thickness and percentage germanium in the SiGe alloy at any given point in time is a direct function of hydrogen partial pressure. It should also be appreciated from FIG. 5 that hydrogen evolution is especially sensitive to the concentration of germanium at the deposition surface and thus to the amount of germanium incorporated in the SiGe alloy film.

Therefore, it is seen that the invention provides for an in-situ, real-time determination and/or control of the germanium content profile over the thickness of a deposited film without time-consuming and destructive testing of the film after deposition. A less extensive calibration measuring silicon film thickness during a process in the absence of germane gas to determine silicon film deposition rate also can be beneficially exploited to provide a more sensitive measurement of process temperature during silicon film deposition, as will be discussed below, with resultant improvement in process control to achieve closely regulated silicon film thickness.

As a practical matter, the calibration can potentially be complicated by several factors. For example, some hydrogen evolution will be due to deposition of silicon or SiGe alloy on polycrystalline silicon which may be present on the interior of the reactor vessel in which the deposition is performed. However, as noted above, film deposition on polysilicon proceeds much more slowly than deposition on monocrystalline silicon and the hydrogen evolution due to deposition on polysilicon will generally be manifested as a low level background partial pressure which will be specific to the reactor vessel. Therefore, calibration as described above which is directed to variation in hydrogen partial pressure with variation in other process parameters is generally sufficient to avoid causing significant errors in germanium percentage or temperature determination and silicon film thickness.

Another potential complication is variation in silane mass flow rate. However, for silicon growth with pure silane, this source of error can be resolved by measurement of total chamber pressure since variation in total chamber pressure would be principally due to variation in silane mass flow rate since the deposition process is slow and variation in hydrogen partial pressure due to temperature drifts would be small relative to total vessel pressure change.

Figure 7:
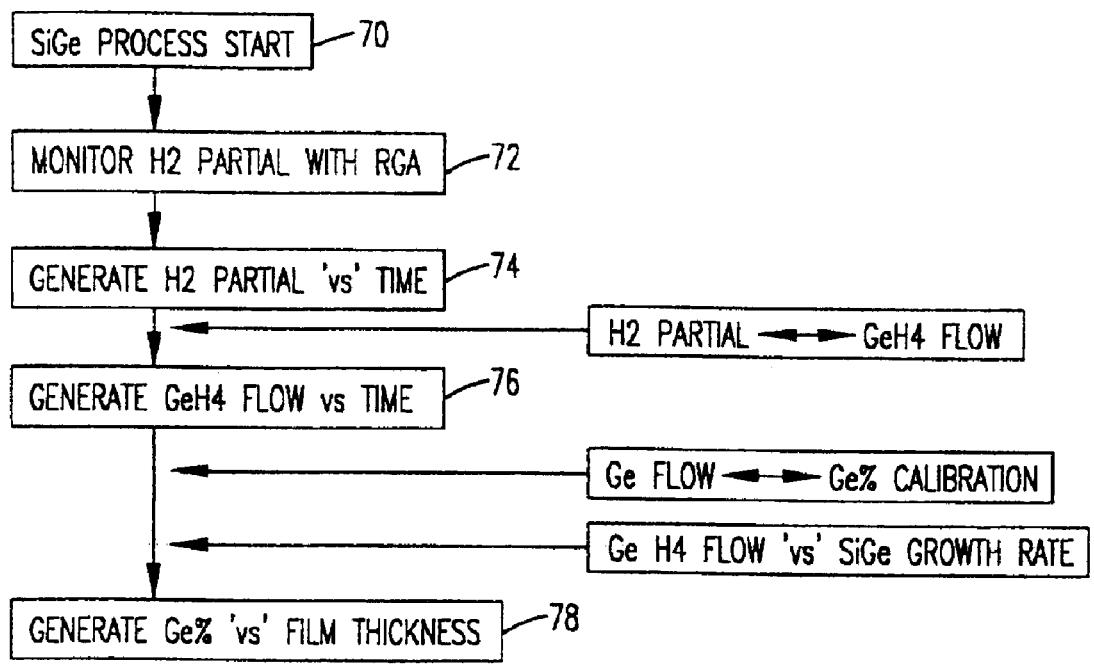
FIGS. 7 and 8 are block diagrams showing development of quantitative values of parameter relationships such as those shown in FIGS. 4–6 in accordance with practice of the invention.

Referring now to FIG. 7, the development of a SiGe alloy film with desired germanium content profile will be explained. The upper portion of FIG. 7 pictorially represents the calibration process that develops quantitative relationships between process parameters, as described above. These relationships are then used for conversions from hydrogen partial pressures determined from residual gas analysis (RGA) to allow determination and/or control of the germanium content profile during the process.

Specifically, once an SiGe alloy deposition process is started (70), the hydrogen partial pressure can be monitored with a residual gas analyzer, as indicated at 72. The hydrogen partial pressure data can be collected over time, as indicated at 74 and the hydrogen partial pressure/germane flow rate calibration can be used to directly measure or adjust germane flow rate at any time or over the duration of the process, as indicated at 76. Since the germanium content in the SiGe alloy film is a function of germane flow, the germanium content at any time during the process can be computed from the germane flow indicated by the hydrogen gas evolution and a conversion for the alloy film growth rate as a function of germanium content allows conversion of the germane flow determined from the hydrogen partial pressure variation over time to a profile of the germanium content over the film thickness, as shown at 78.

Figure 8:
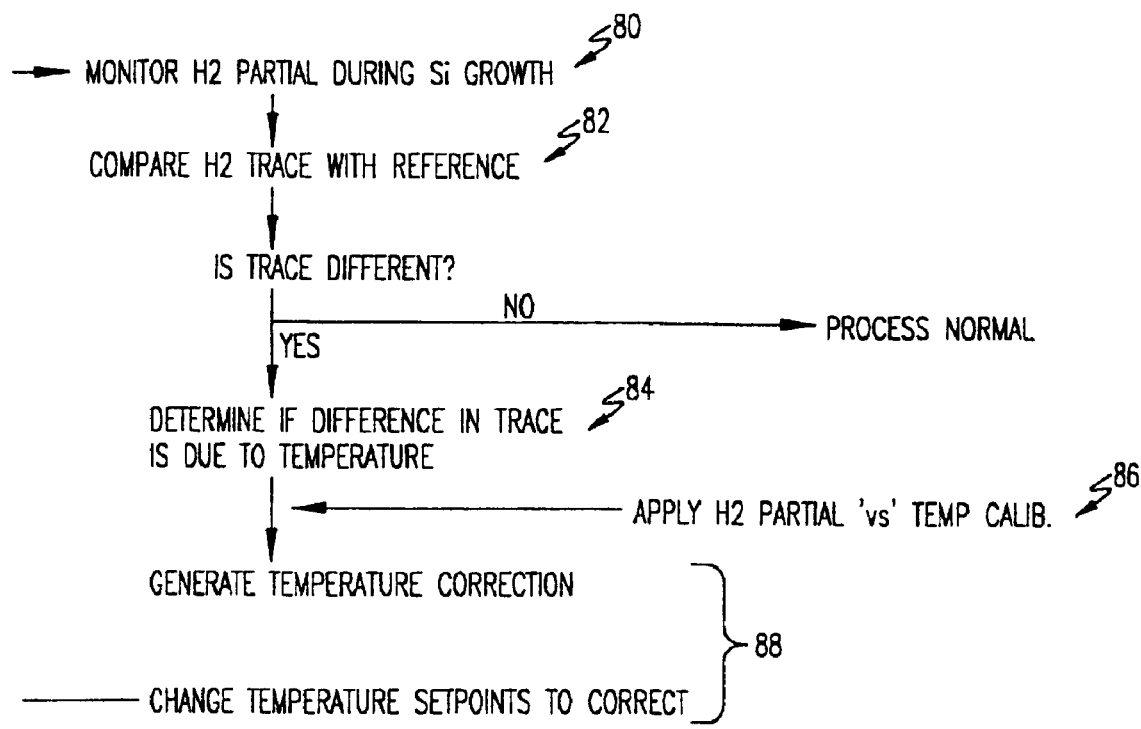

Referring now to FIG. 8, a process of temperature measurement of enhanced sensitivity and effectiveness will now be discussed. Only the relationship between the hydrogen gas partial pressure and temperature, as developed in the calibration process, need be used. As indicated at 80, the hydrogen partial pressure is monitored and preferably compared with a reference value or trace, as indicated at 82. If the hydrogen partial pressure is as expected, no correction is necessary. If the hydrogen partial pressure differs from the expected value, it is first determined if the variation is due to temperature, as indicated at 84, since, as alluded to above, the hydrogen partial pressure can be affected by variations in the silane flow rate. That is, by determining the total pressure, it can be deduced whether or not the silane flow rate is likely to be the cause of the variation in hydrogen partial pressure, as discussed above.

If the difference is determined to be due to temperature drift, the calibration of the hydrogen partial pressure and temperature is applied to determine a temperature correction and/or change of process set point to achieve the desired growth rate. Compensation can also be achieved though alteration of process duration, either alone or in combination with temperature correction in order to achieve desired film thickness.

Figure 9:
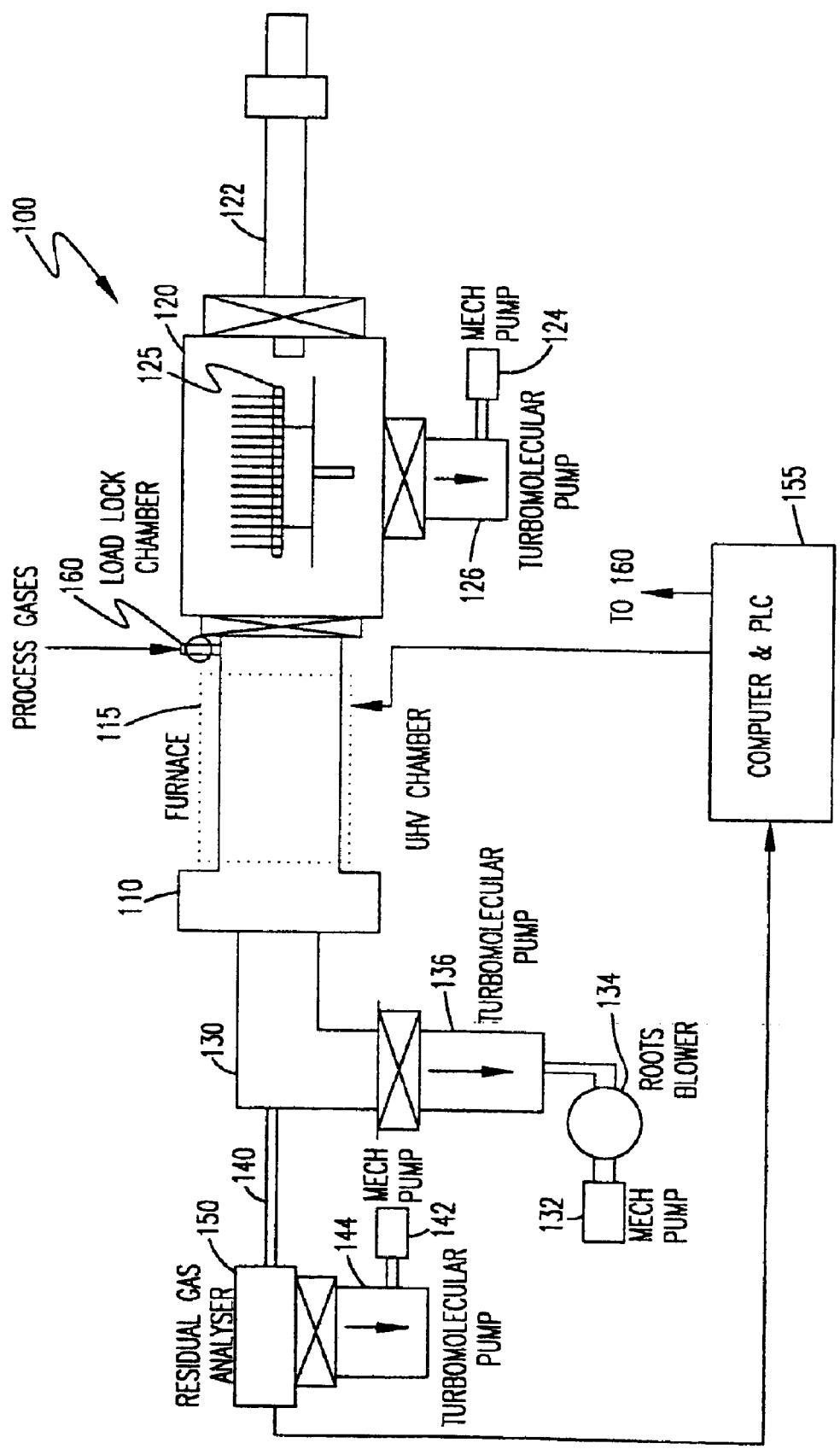
FIG. 9 is a schematic depiction of exemplary apparatus for practice of the invention.

Referring now to FIG. 9, a preferred apparatus 100 for practice of the invention is schematically shown. Central to the film deposition process is an ultra-high vacuum (UHV) chamber 110 and furnace 115 for developing the vacuum levels and temperatures required for sputtering. It should be understood that the invention is applicable to numerous types of processes for deposition of films including but not limited to plasma enhanced chemical vapor deposition (PECVD), low pressure chemical vapor deposition (LPCVD), rapid thermal chemical vapor deposition (RTCVD), and the like. However, it is considered that the invention is particularly well-suited to processes which are conducted at temperatures from about 400° C. to about 650° C. and at pressures from about 10–3 Torr to about 5 Torr or greater. These pressures are developed by a pumping arrangement such as the mechanical pump 132, Roots blower 134 and turbomolecular pump 136, schematically illustrated and connected serially to duct 130.

While not of importance to the successful practice of the invention, it is also generally convenient to provide the reaction vessel/UHV chamber 110 with a load lock chamber 120 including a loading mechanism 122 for charging the chamber 110 with wafers to be processed, generally utilizing a boat 125. If a load lock chamber is provided, it is generally desirable to provide an arrangement for developing a desired vacuum level in the load lock chamber 120 independently of the chamber 110 as is illustrated by the schematic depiction of mechanical pump 124 and turbomolecular pump 126.

In accordance with the invention, an additional duct 140 is connected to duct 130 and gas flow therethrough is developed by an additional pumping arrangement schematically illustrated by mechanical pump 142 and turbomolecular pump 144. A residual-gas analyzer (RGA) 150 is placed between duct 140 and the additional pumping arrangement in order to have residual reaction product gases passed therethrough for analysis.

Details of the RGA are not particularly important to the practice of the invention but it is desirable that the output of the RGA be in the form of partial pressures of detected gases and that the RGA have the capability of monitoring total pressure in chamber 110. This latter capability is useful in detecting drift of the mass flow rate of reaction process gases which may cause variation in the amount of evolved hydrogen, as alluded to above, and cause error in temperature monitoring in accordance with the invention. It is also desirable that the RGA be capable of repetitive sampling of the residual reaction product gases at intervals which are short compared to the deposition time of a film of the desired thickness. A sampling interval of about 0.7 seconds has been found satisfactory for film thicknesses and material concentration profile resolution currently of interest for semiconductor device designs currently being developed.

The output of the RGA is provided to a computer and programmable logic controller (PLC) 155 which issuitably programmed to provide control of temperature and mass flow of process gases in accordance with any desired film thickness or alloy material concentration, as discussed above. Temperature and silane flow will generally be nominally constant but could be varied or the set points for nominally constant values could be adjusted to compensate for temperature or flow rate drift. Germane flow can be controlled at any value and rapidly changed to develop any desired alloy material profile with high accuracy and resolution since the monitored partial pressure of hydrogen is a direct indicator of the germanium concentration at the deposition surface at any instant during the deposition process.

In summary, in accordance with the invention, small changes in temperature and/or germanium concentration result in relatively large and quantitatively identifiable changes in hydrogen partial pressure in residual gases during deposition of a silicon or SiGe alloy film. These changes in hydrogen partial pressure can be detected with high accuracy and resolution by a residual gas analyzer and, when calibrated for a particular film deposition apparatus 100, allow conversion of hydrogen partial pressure data collected over time to a material concentration profile over a film thickness or at any position within a film thickness (with a very high precision dependent on film deposition rate and sampling frequency) and/or temperature monitoring and control of substantially improved resolution for extremely accurate control of film thickness.

The process in accordance with the invention is of particularly high precision since the evolution of hydrogen is a direct indicator of reaction conditions at the deposition surface. Interfering mechanisms are relatively few and easily accommodated whereas known optical testing techniques are inherently of low resolution and complicated by unavoidable requirements for optical windows which are subject to material deposition. The accuracy of alloy composition is generally greater than 1% and temperature drifts of as little as 5° C. or about 1% allowing process compensation to develop film thicknesses with comparable accuracy. In comparison, known temperature monitoring and control arrangements provide a temperature resolution of several tens of degrees centigrade. SIMS testing, which is time-consuming, expensive and destructive is avoided by the invention which provides real-time measurements in-situ and without destruction of the samples and with comparable accuracy and is suitable for routine process monitoring.

While the invention has been described in terms of a single preferred embodiment, those skilled in the art will recognize that the invention can be practiced with modification within the spirit and scope of the appended claims.

What is claimed is:

1. A method of depositing a film containing silicon on a crystalline silicon surface, said method including steps of
    introducing a gas containing precursor material into a reaction vessel, a constituent material of said precursor material producing evolution of a distinctive amount of hydrogen relative to mass flow rate upon deposition alone or in combination with another constituent material of said precursor material,
    adsorbing an activated species formed from said precursor material on said crystalline silicon surface, and
    determining a partial pressure of hydrogen in residual gases as said activated species is deposited on said crystalline silicon surface,
    controlling in real time at least one of temperature and mass flow of said precursor material in said reactor vessel in response to said partial pressure of hydrogen.

2. A method as recited in claim 1 including the further steps of monitoring total residual gas pressure in said reactor vessel, and evaluating changes in said partial pressure of hydrogen based on said total pressure.

3. A method as recited in claim 1 wherein said film is epitaxial silicon.

4. A method as recited in claim 1 wherein said film is an alloy of silicon and germanium.

5. A method as recited in claim 1, including the further steps of repetitively sampling said residual gases, and converting said partial pressure of hydrogen corresponding to respective samples to a property of said film.

6. A method as recited in claim 5, wherein said property of said film is a film thickness.

7. A method as recited in claim 5, wherein said property of said film is a concentration of a material.

8. A method as recited in claim 5, wherein said film is an alloy of silicon and germanium and said property is a germanium concentration profile.

9. A method as recited in claim 1, wherein said film includes a film of silicon and a film of an alloy of silicon and germanium.

10. Apparatus for depositing a film containing silicon on a crystalline silicon surface including means for introducing a gas containing precursor material into a reaction vessel such that an activated species formed from said precursor material is adsorbed on said crystalline silicon surface, a constituent material of said precursor material producing evolution of a distinctive amount of hydrogen relative to mass flow rate upon deposition alone or in combination with another constituent material of said precursor material, and means for determining a partial pressure of hydrogen in residual gases as said activated species is deposited on said crystalline silicon surface, means for controlling in real time at least one of temperature and mass flow of said precursor material in said reactor vessel in response to said partial pressure of hydrogen.

11. Apparatus as recited in claim 10, further including means for monitoring total residual gas pressure in said reactor vessel, and means for evaluating changes in said partial pressure of hydrogen based on said total pressure.

12. Apparatus as recited in claim 10 wherein said film is epitaxial silicon.

13. Apparatus as recited in claim 10 wherein said film is an alloy of silicon and germanium.

14. Apparatus as recited in claim 10 further including means for repetitively sampling said residual gases, and means for converting said partial pressure of hydrogen corresponding to respective samples to a property of said film.

15. Apparatus as recited in claim 14, wherein said property of said film is a film thickness.

16. Apparatus as recited in claim 14, wherein said property of said film is a concentration of a material.

17. Apparatus as recited in claim 14, wherein said film is an alloy of silicon and germanium and said property is a germanium concentration profile.

18. Apparatus as recited in claim 10, wherein said film includes a film of silicon and a film of an alloy of silicon and germanium.

* * * * *